United States Patent
Misawa

(10) Patent No.: US 7,663,144 B2
(45) Date of Patent: Feb. 16, 2010

(54) SOLID-STATE IMAGING DEVICE INCLUDING A PLURALITY OF PIXEL PARTS WITH A PHOTOELECTRIC CONVERSION LAYER

(75) Inventor: Takeshi Misawa, Asaka (JP)

(73) Assignee: Fujifilm Corporation, Tokyo (JP)

( * ) Notice: Subject to any disclaimer, the term of this patent is extended or adjusted under 35 U.S.C. 154(b) by 230 days.

(21) Appl. No.: 11/347,215

(22) Filed: Feb. 6, 2006

(65) Prior Publication Data

US 2006/0186408 A1 Aug. 24, 2006

(30) Foreign Application Priority Data

Feb. 7, 2005 (JP) ............................. 2005-030197
Aug. 18, 2005 (JP) ............................. 2005-237607

(51) Int. Cl.
*H01L 27/148* (2006.01)
(52) U.S. Cl. .................................. 257/59; 257/E27.152
(58) Field of Classification Search .................. 257/59, 257/E27.152; 348/272, 275
See application file for complete search history.

(56) References Cited

U.S. PATENT DOCUMENTS

| | | | | | |
|---|---|---|---|---|---|
| 4,438,455 | A | * | 3/1984 | Tabei | 348/280 |
| 5,408,345 | A | * | 4/1995 | Mitsui et al. | 349/42 |
| 5,760,431 | A | * | 6/1998 | Savoye et al. | 257/240 |
| 6,225,966 | B1 | * | 5/2001 | Ohtani et al. | 345/87 |
| 6,236,434 | B1 | * | 5/2001 | Yamada | 348/315 |

* cited by examiner

*Primary Examiner*—Lynne A. Gurley
*Assistant Examiner*—Colleen A Matthews
(74) *Attorney, Agent, or Firm*—Birch, Stewart, Kolasch & Birch, LLP

(57) ABSTRACT

A solid-state imaging device is provided and has a plurality of pixel parts including three photoelectric conversion layers stacked above a semiconductor substrate, the plurality of pixel parts being arranged above the semiconductor substrate. The three photoelectric conversion layers, respectively, included in one pixel part are interposed between pixel electrode layers and opposing electrode layers. A region thus interposed is made a pixel region that generates a signal charge for formation of one pixel data. The pixel region includes a convex portion and a concave portion as viewed in plane view, and a part of the convex portion is arranged in a manner to put in a concave portion in a pixel region of an adjacent pixel part.

9 Claims, 9 Drawing Sheets

FIG. 10

| Gb | B | Gb | B | Gb | B |
|----|---|----|---|----|---|
| R  | Ga | R | Ga | R | Ga |
| Gb | B | Gb | B | Gb | B |
| R  | Ga | R | Ga | R | Ga |
| Gb | B | Gb | B | Gb | B |
| R  | Ga | R | Ga | R | Ga |

FIG. 11

| 1/4 |     |     |
|-----|-----|-----|
|     | 1/2 |     |
|     |     | 1/4 |

LIGHT INCIDENCE

SOLID-STATE IMAGING DEVICE INCLUDING A PLURALITY OF PIXEL PARTS WITH A PHOTOELECTRIC CONVERSION LAYER

FIELD OF THE INVENTION

The present invention relates to a solid-state imaging device, in which a plurality of pixel parts including a photoelectric conversion layer stacked on a semiconductor substrate are arranged on the semiconductor substrate.

BACKGROUND OF THE INVENTION

In the related art, a stacked-type solid-state imaging device described in, for example, JP-A-58-103165, JP-A-63-300575 and JP-A-2003-332551 is proposed as a solid-state imaging device structured such that any color filter is not used. With the stacked-type solid-state imaging device, three photoelectric conversion layers of an organic material and serving to detect, for example, red color (R), green color (G), and blue color (B) are stacked above a semiconductor substrate, signal charge generated in the respective layers is accumulated in a storage diode formed on the semiconductor substrate, and a signal readout circuit, such as vertical CCD, horizontal CCD, etc., formed on the semiconductor substrate reads the signal charge accumulated in the storage diode to transfer the same. With such stacked-type solid-state imaging device, it is possible to improve a light efficiency to create a color image of high image quality while suppressing a false color.

The stacked-type solid-state imaging device involves a problem that aliasing is generated likewise a single plate type solid-state imaging device. While an optical low-pass filter is used in a camera or the like, on which a single plate type solid-state imaging device is mounted, in order to suppress aliasing, such optical low-pass filter is expensive to cause an increase in manufacturing cost of a camera and to constitute a factor that hampers miniaturization of the camera.

SUMMARY OF THE INVENTION

An object of an illustrative, non-limiting embodiment of the invention is to provide a solid-state imaging device structured such that photoelectric conversion layers are stacked above a semiconductor substrate, which enables suppressing aliasing without hampering reduction in cost and miniaturization of an imaging apparatus mounting thereon the solid-state imaging device.

A solid-state imaging device of an illustrative, non-limiting embodiment of the invention includes: a semiconductor substrate; and a plurality of pixel parts including a photoelectric conversion layer stacked on the semiconductor substrate, the plurality of pixel parts being arranged on the semiconductor substrate. (That is, in the embodiment, the photoelectric conversion layer is stacked in a direction perpendicular to the semiconductor substrate, and the plurality of pixel parts is arranged in a plane parallel to the semiconductor substrate.) The photoelectric conversion layer includes pixel regions generating signal charge used for formation of pixel data. The configuration and arrangement of the pixel regions are determined so that a straight line (a first straight line) extending in a direction (a first direction) perpendicular to a specific direction (a second direction) and intersecting two respective pixel regions aligning adjacent to each other in the specific direction can be drawn as viewed in plan view. (That is, the pixel regions have a configuration and arrangement determined so that a first straight line extending in a first direction in the plane parallel to the semiconductor substrate intersects two respective pixel regions aligning adjacent to each other in a second direction perpendicular to the first direction.)

By adopting such configuration, since a range of light detectable in an optional pixel region in a specific direction partially overlaps a range of light detectable in a pixel region adjacent thereto, it is possible to realize the function equivalent to that of a low-pass filter and to suppress generation of aliasing in the specific direction. Accordingly, it is possible to suppress aliasing without hampering reduction in cost and miniaturization of an imaging apparatus mounting thereon a solid-state imaging device.

In the solid-state imaging device according to the embodiment, the pixel regions may be in the form of a parallelogram as viewed in plan view (i.e., in the plane parallel to the semiconductor substrate).

In the solid-state imaging device according to the embodiment, the pixel regions may include a first convex portion projecting in the specific direction and a first concave portion dented in the specific direction as viewed in plan view, and arranged so that a part of the first convex portion of a pixel region puts into (or bites into) the first concave portion of an adjoining pixel region in the specific direction The solid-state imaging device according to the embodiment may include an optical low-pass filter that suppresses generation of aliasing in a direction perpendicular to the specific direction.

By adopting such configuration, it is possible to prevent aliasing in both the specific direction and a direction perpendicular thereto.

In the solid-state imaging device according to the embodiment, the configuration and arrangement of the pixel regions are determined so that in addition to the straight line (the first straight line), another straight line (a second straight line) extending in the specific direction and intersecting two respective pixel regions aligning adjacent to each other in a direction perpendicular to the specific direction also can be drawn. (That is, the pixel regions have a configuration and arrangement determined so that a second straight line extending in the second direction intersects two respective pixel regions aligning adjacent to each other in the first direction.)

By adopting such configuration, since a range of light detectable in an optional pixel region in a specific direction and in a direction perpendicular thereto partially overlaps a range of light detectable in a pixel region adjacent thereto, it is possible to realize the function equivalent to that of a low-pass filter and to suppress generation of aliasing in the specific direction and in the direction perpendicular thereto. Accordingly, it is possible to suppress aliasing without hampering reduction in cost and miniaturization of an imaging apparatus mounting thereon a solid-state imaging device.

In the solid-state imaging device according to the embodiment, the pixel regions may include: a first convex portion projecting in the specific direction; a first concave portion dented in the specific direction; a second convex portion projecting in a direction perpendicular to the specific direction; and a second concave portion dented in a direction perpendicular to the specific direction as viewed in plan view, and can be arranged so that a part of the first convex portion of a pixel region puts into the first concave portion of an adjoining pixel region in the specific direction, and a part of the second convex portion of the pixel region puts into the second concave portion of an adjoining pixel region in the direction perpendicular to the specific direction.

A solid-state imaging device of another illustrative, non-limiting embodiment of the invention includes: a semiconductor substrate; and a plurality of pixel parts including a plurality of photoelectric conversion layers stacked on a semiconductor substrate, the plurality of pixel parts being arranged on the semiconductor substrate. (That is, in the embodiment, the plurality of photoelectric conversion layers is stacked in a direction perpendicular to the semiconductor substrate, and the plurality of pixel parts is arranged in a plane parallel to the semiconductor substrate.) Each of the photoelectric conversion layers includes pixel regions generating signal charge used for formation of pixel data. Each of the pixel regions in at least one of the plurality of photoelectric conversion layers is divided into a plurality of sections.

By adopting such configuration, it is possible to suppress generation of aliasing without the use of any optical low-pass filter and to suppress aliasing without hampering reduction in cost and miniaturization of an imaging apparatus mounting thereon a solid-state imaging-device.

In the solid-state imaging device according to the embodiment, the pixel regions divided into the plurality of sections may have a common configuration as viewed in plan view (i.e., in the plane parallel to the semiconductor substrate).

By adopting such configuration, it is possible to suppress generation of aliasing further effectively.

In the solid-state imaging device according to the embodiment, the at least one photoelectric conversion layers including the pixel regions divided into the plurality of sections, includes one that detects green color.

According to the invention, in a solid-state imaging device structured such that photoelectric conversion layers are stacked above a semiconductor substrate, it is possible to suppress aliasing without hampering reduction in cost and miniaturization of an imaging apparatus mounting thereon the solid-state imaging device.

BRIEF DESCRIPTION OF THE DRAWINGS

FIG. 10 is a view showing a state, in which signals obtained from the solid-state imaging device shown in FIG. 9 are mapped on a memory.

FIG. 11 is a view showing filter coefficients used for creation of a G signal.

DETAILED DESCRIPTION OF THE INVENTION

Exemplary embodiments of the invention will be described below with reference to the drawings.

First Embodiment

Figure 1:
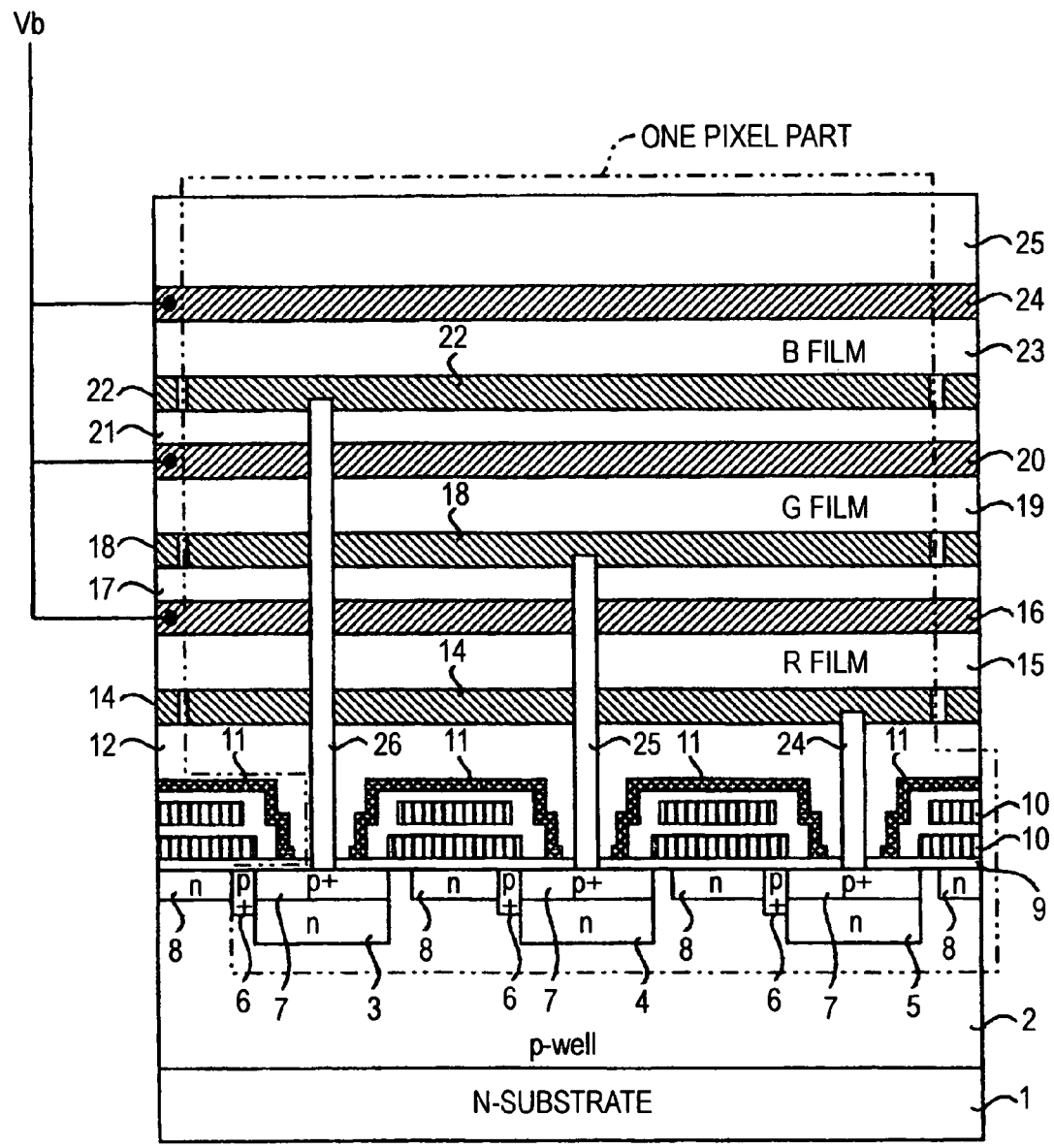
FIG. 1 is a schematic sectional view showing a fundamental structure of a pixel part of a solid-state imaging device to illustrate a first exemplary embodiment of the invention.

FIG. 1 is a schematic sectional view showing a fundamental structure of a pixel part of a solid-state imaging device to illustrate a first exemplary embodiment of the invention. A solid-state imaging device according to the embodiment includes pixel parts shown in FIG. 1 and arranged in a plurality of rows (for example, arranged in a square lattice).

As shown in FIG. 1, an R photoelectric conversion layer 15, which detects red (R) light and generates a red-color signal charge corresponding to the light, a G photoelectric conversion layer 19, which detects green (G) light and generates a green-color signal charge corresponding to the light, and a B photoelectric conversion layer 23, which detects blue (B) light and generates a blue-color signal charge corresponding to the light, are stacked in this order above a n-type semiconductor substrate 1. In addition, the number of and the order of stacking of the respective photoelectric conversion layers are not limited thereto. Also, it is preferable to use organic materials for materials of the respective photoelectric conversion layers.

The R photoelectric conversion layer 15 is interposed between a pixel electrode layer 14 and an opposing electrode layer 16. The G photoelectric conversion layer 19 is interposed between a pixel electrode layer 18 and an opposing electrode layer 20. The B photoelectric conversion layer 23 is interposed between a pixel electrode layer 22 and an opposing electrode layer 24.

A transparent insulating layer 17 is provided between the opposing electrode layer 16 and the pixel electrode layer 18, a transparent insulating layer 21 is provided between the opposing electrode layer 20 and the opposing electrode layer 20, and a transparent insulating layer 25 is provided on the opposing electrode layer 24.

The pixel electrode layers 14, 18, 22 are divided every pixel part. While the opposing electrode layers 16, 20, 24 are not divided every pixel part since they can be used in common to all pixel parts, they may be divided. Also, the respective photoelectric conversion layers may be likewise divided every pixel part.

A signal charge generated in a region (referred below to as R pixel region) of the R photoelectric conversion layer 15 interposed between the pixel electrode layer 14 and the opposing electrode layer 16 makes a signal charge used for formation of one pixel data (data for formation of one pixel) obtained from the pixel part. A signal charge generated in a region (referred below to as G pixel region) of the G photoelectric conversion layer 19 interposed between the pixel electrode layer 18 and the opposing electrode layer 20 makes a signal charge used for formation of one pixel data (data for formation of one pixel) obtained from the pixel part. A signal charge generated in a region (referred below to as B pixel region) of the B photoelectric conversion layer 23 interposed between the pixel electrode layer 22 and the opposing electrode layer 24 makes a signal charge used for formation of one pixel data (data for formation of one pixel) obtained from the pixel part.

Formed on a surface portion of the n-type semiconductor substrate 1 is a p-well layer 2, and formed on a surface portion of the p-well layer 2 are a n region 3, which accumulates a signal charge generated in the B pixel region, a n region 4, which accumulates a signal charge generated in the G pixel region, and a n region 5, which accumulates a signal charge generated in the R pixel region.

Provided on the right of and a little away from the respective n regions 3 to 5 are n regions 8 extending in a direction perpendicular to the surface of the figure, the respective n regions 8 forming a vertical transfer path (VCCD). Transport electrodes 10 made of polysilicon serving an electrode are formed on surface portions of the n regions 8 to reach the n regions 3 to 5, and shield layers 11 are provided on the respective transfer electrodes 10.

Provided on left sides of and surface portions of the respective n regions 3 to 5 are p+regions 6, 7 to be separate from adjacent vertical transfer paths 8 and to achieve reduction in defect level of the surface portions. Formed on a topmost surface of the n-type semiconductor substrate 1 is an oxide silicon layer 9, on which the transfer electrodes 10 are formed.

The pixel electrode layer 22 and the n region 3 are connected to each other by means of a vertical wire 26. The vertical wire 26 is electrically insulated from other elements than the pixel electrode layer 22 and the n region 3, to which the vertical wire is connected. The pixel electrode layer 18 and the n region 4 are connected to each other by means of a vertical wire 25. The vertical wire 25 is electrically insulated from other elements than the pixel electrode layer 18 and the n region 4, to which the vertical wire is connected. The pixel electrode layer 14 and the n region 5 are connected to each other by means of a vertical wire 24. The vertical wire 24 is electrically insulated from other elements than the pixel electrode layer 14 and the n region 5, to which the vertical wire is connected.

The shield layers 11 and the transfer electrodes 10 are embedded in a transparent insulating layer 12.

The solid-state imaging device according to the embodiment is structured such that a signal charge generated in the B pixel region is accumulated in the n region 3, a signal charge generated in the G pixel region is accumulated in the n region 4, a signal charge generated in the R pixel region is accumulated in the n region 5, the signal charge as accumulated there is transferred in a vertical direction by the n region 8 in the same manner as in a conventional CCD type image sensor, the signal charge as transferred is transferred in a horizontal direction by a horizontal transfer path (HCCD) (not shown), and a color signal corresponding to the signal charge as transferred is output from an amplifier (not shown).

In this manner, one pixel part of the solid-state imaging device according to the embodiment includes the R photoelectric conversion layer 15, the G photoelectric conversion layer 19, the B photoelectric conversion layer 23, and the n regions 3 to 5 and the n region 8, which are provided corresponding to the respective photoelectric conversion layers. Since an R signal, a G signal, and a B signal are obtained from the pixel part, they can form one pixel data.

While the fundamental structure of the solid-state imaging device is described above, measures in the embodiment are taken to suppress aliasing among signals obtained from the respective pixel parts. The measures will be described below.

FIGS. 2 to 6 are plan views showing four pixel parts of the solid-state imaging device as viewed from an incident side of light (in a direction perpendicular to the semiconductor substrate 1) to explain the first embodiment of the invention. FIGS. 2 to 6 show only the pixel electrode layers 14, 18, 22 included in the respective pixel parts. Since the photoelectric conversion layers 15, 19, 23 and the opposing electrode layers 16, 20, 24 are actually stacked over an entire surface above the pixel electrode layers 14, 18, 22 shown in FIGS. 2 to 6, the pixel electrode layers 14, 18, 22 are the same in area as viewed in plan view as the R pixel region, the G pixel region, and the B pixel region as viewed in plan view.

Figure 2:
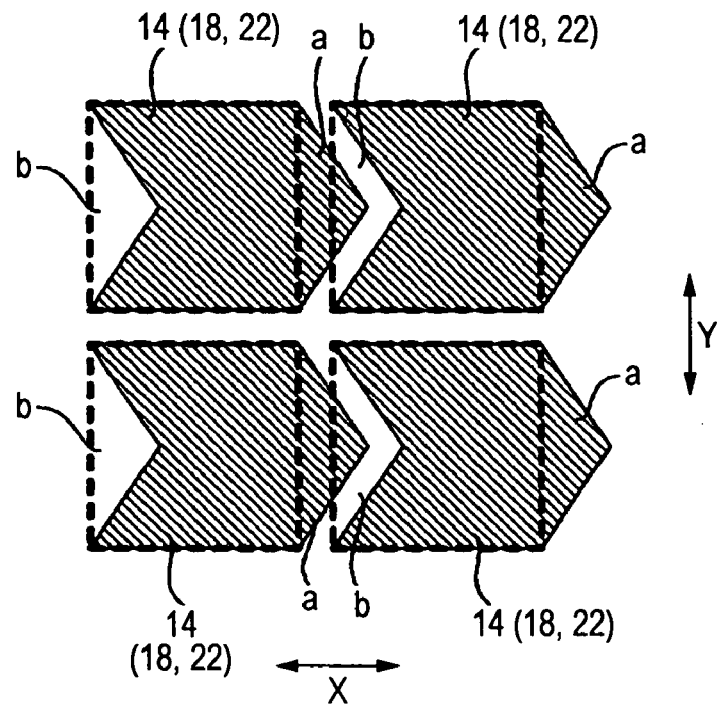
FIG. 2 is a plan view showing four pixel parts of the solid-state imaging device to illustrate the first embodiment of the invention, as viewed from a light incident side.

Assuming that according to a standard when the pixel electrode layers 14, 18, 22 are in the form of a quadrangle (for example, a square (a shape indicated by dotted lines in FIGS. 2 to 4)) free of concave and convex portions, portions projecting from the square make convex portions and portions dented from the square make concave portions, the pixel electrode layers 14, 18, 22 included in the respective pixel parts in the example shown in FIG. 2 include a convex portion a (first convex portion) projecting in the horizontal direction (a X-direction in the figure) and a concave portion b (first concave portion) dented in the horizontal direction, and a part of the convex portion a is arranged in a manner to put in the concave portion b of the pixel electrode layers 14, 18, 22 of the horizontally adjoining pixel part. Owing to such configuration and arrangement, a straight line extending in the vertical direction (a Y-direction in the figure) perpendicular to the horizontal direction and intersecting the respective two pixel electrode layers 14, 18, 22 aligning adjacent to each other in the horizontal direction is present in a plan view shown in FIG. 2.

By adopting such structure, since a range of light detectable in an optional pixel region in the horizontal direction partially overlaps a range of light detectable in a pixel region adjacent thereto, it is possible to realize the function equivalent to that of a low-pass filter and to suppress generation of aliasing in the horizontal direction. In addition, even when a direction, in which the convex portion a projects, and a direction, in which the concave portion b is dented, are vertical, it is possible to produce the same effect (in this case, an effect capable of suppressing generation of aliasing in the vertical direction). In addition, a direction, in which the convex portion a projects, and a direction, in which the concave portion b is dented, are not limited to the horizontal and vertical directions but may be, for example, slantwise.

Figure 3:
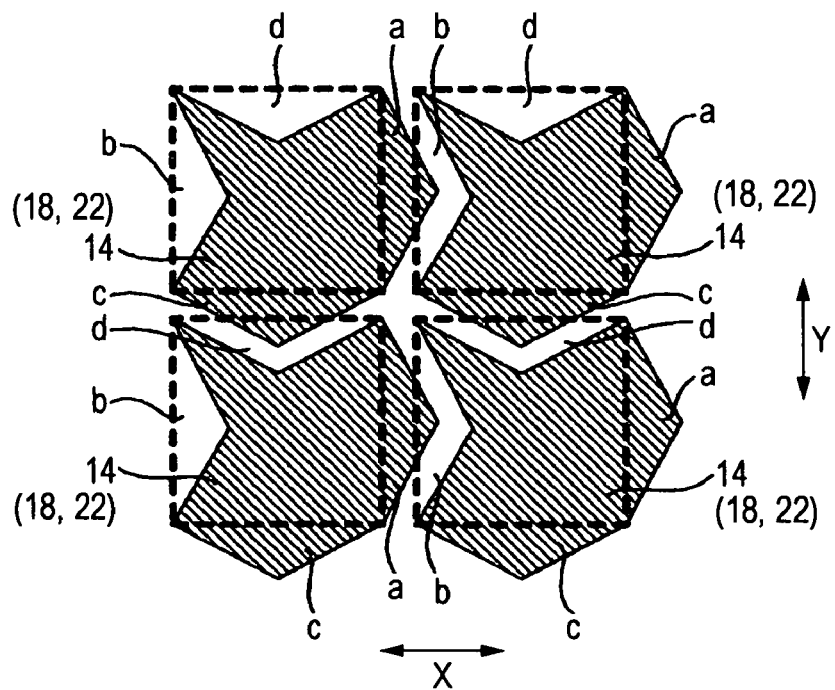
FIG. 3 is a plan view showing four pixel parts of the solid-state imaging device to illustrate the first embodiment of the invention, as viewed from the light incident side.
Figure 4:
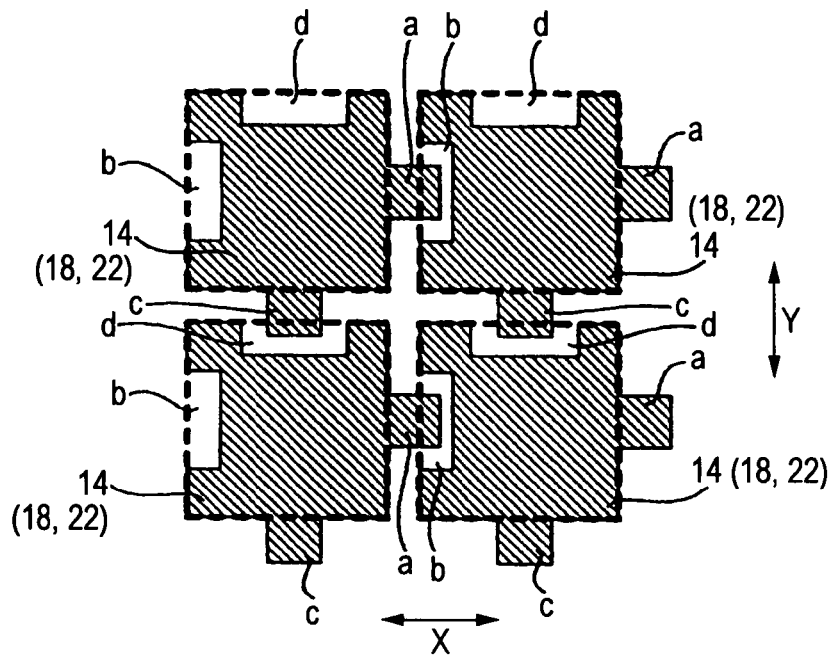
FIG. 4 is a plan view showing four pixel parts of the solid-state imaging device to illustrate the first embodiment of the invention, as viewed from the light incident side.

In examples shown in FIGS. 3 and 4, pixel electrode layers 14, 18, 22 included in the respective pixel parts are shaped to comprise a convex portion a projecting in the horizontal direction (a X-direction in the figure), a concave portion b dented in the horizontal direction, a convex portion c (second convex portion) projecting in the vertical direction (a Y-direction in the figure) perpendicular to the horizontal direction, and a concave portion d (second concave portion) dented in the vertical direction, a part of the convex portion a is arranged in a manner to put in the concave portion b of the pixel electrode layers 14, 18, 22 of the horizontally adjoining pixel part, and a part of the convex portion c is arranged in a manner to put in the concave portion d of the pixel electrode layers 14, 18, 22 of the horizontally adjoining pixel part. Owing to such configuration and arrangement, a straight line extending in the vertical direction perpendicular to the horizontal direction and intersecting the respective two pixel electrode layers 14, 18, 22 aligning adjacent to each other in the horizontal direction, and a straight line extending in the horizontal line perpendicular to the vertical direction and intersecting the respective two pixel electrode layers 14, 18, 22 aligning adjacent to each other in the vertical direction, are present in plan views shown in FIGS. 3 and 4.

By adopting such configuration, it is possible to suppress generation of aliasing in both the horizontal direction and the vertical direction.

Figure 5:
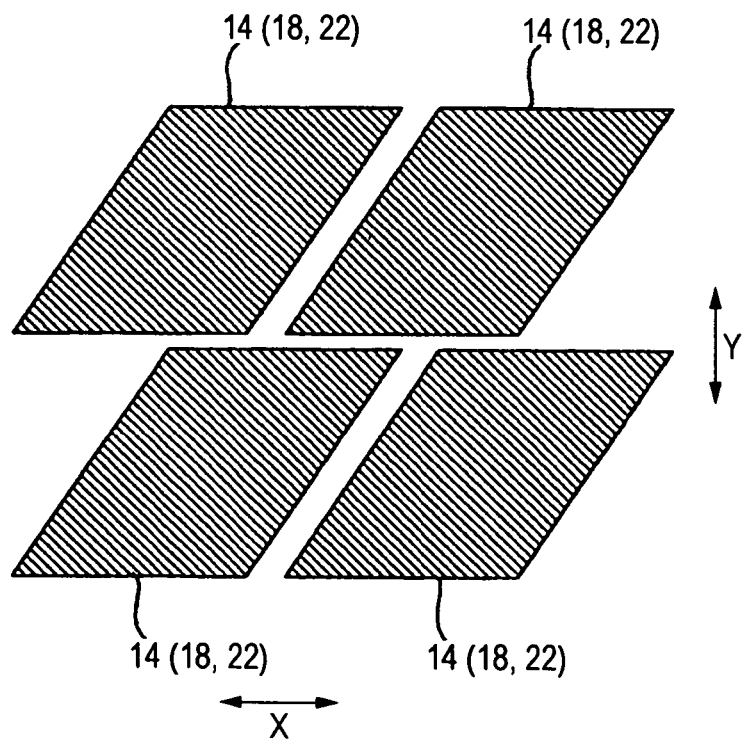
FIG. 5 is a plan view showing four pixel parts of the solid-state imaging device to illustrate the first embodiment of the invention, as viewed from the light incident side.

In an example shown in FIG. 5, pixel electrode layers 14, 18, 22 are in the form of a parallelogram, and the pixel electrode layers 14, 18, 22 are arranged so that straight lines extending in a vertical direction (a Y-direction in the figure) perpendicular to a horizontal direction (a X-direction in the figure) and intersecting the respective two pixel electrode layers 14, 18, 22 aligning adjacent to each other in the horizontal direction can be drawn.

Figure 6:
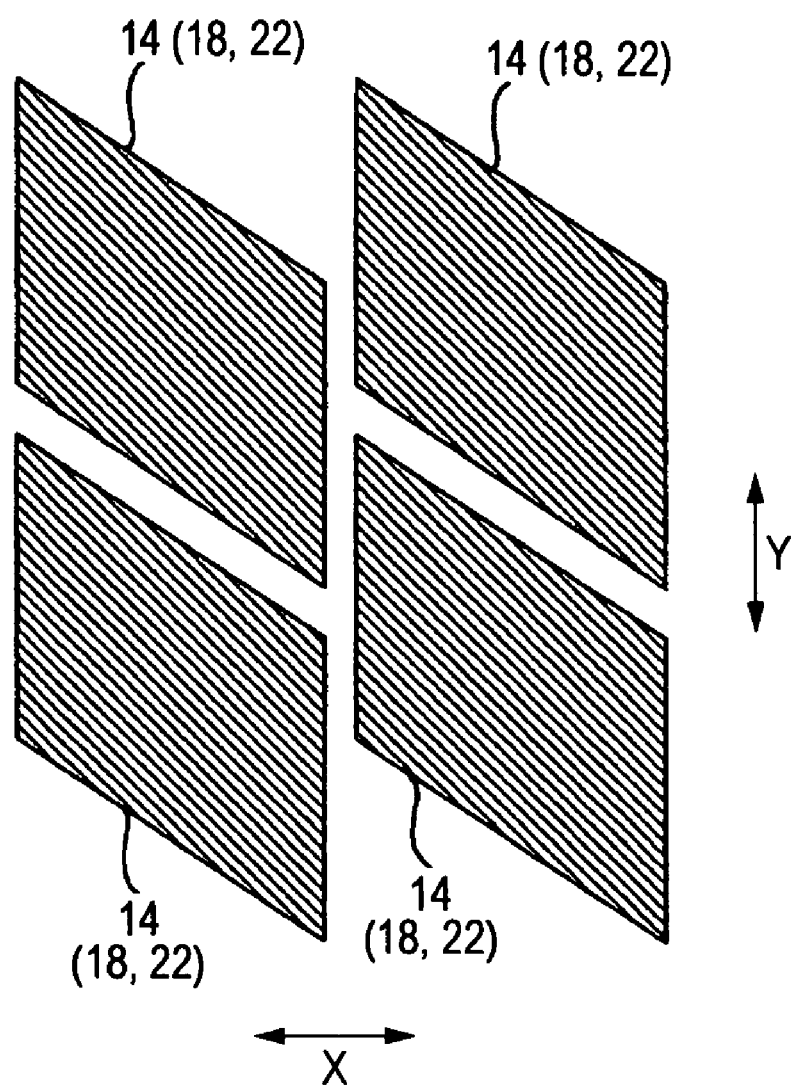
FIG. 6 is a plan view showing four pixel parts of the solid-state imaging device to illustrate the first embodiment of the invention, as viewed from the light incident side.
Figure 7A:
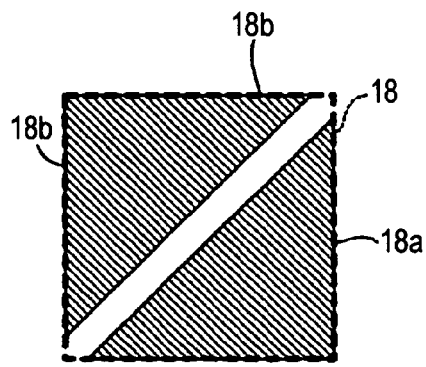
FIGS. 7A to 7D each is a plan view showing that pixel electrode layer included in a solid-state imaging device, by which a second exemplary embodiment of the invention is illustrated, and which is divided into a plurality of sections, as viewed from a light incident side.
Figure 7C:
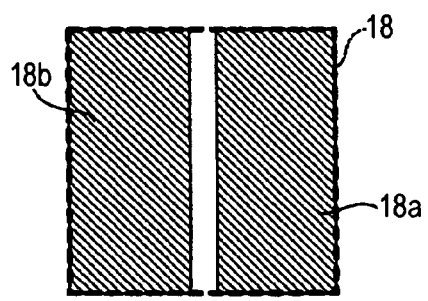
Figure 7B:
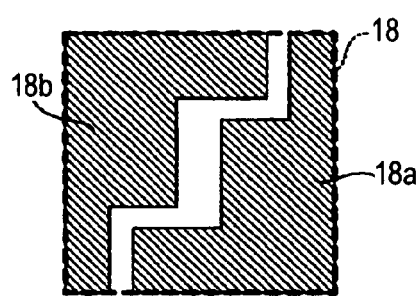
Figure 7D:
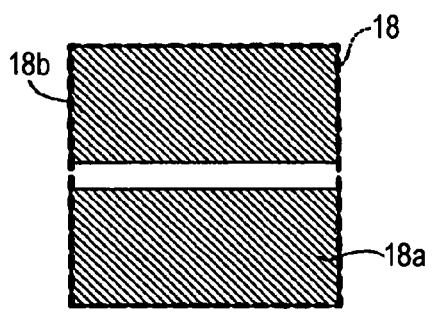

In an example shown in FIG. 6, pixel electrode layers 14, 18, 22 are in the form of a parallelogram, and the pixel electrode layers 14, 18, 22 are arranged so that straight lines extending in a horizontal direction (a X-direction in the figure) perpendicular to a vertical direction (a Y-direction in the figure) and intersecting the respective two pixel electrode layers 14, 18, 22 aligning adjacent to each other in the vertical direction can be drawn.

By adopting such configuration, since a range of light detectable in an optional pixel region in the horizontal direction or in the vertical direction partially overlaps a range of light detectable in a pixel region adjacent thereto, it is possible to realize the function equivalent to that of a low-pass filter and to suppress generation of aliasing in the horizontal direction or in the vertical direction.

In addition, while aliasing is suppressed by contriving the configuration and arrangement of the pixel electrode layers 14, 18, 22 in FIGS. 2 to 6, the same effect as described above can be also produced by dividing the respective pixel electrode layers 14, 18, 22 every pixel part and making the configuration and arrangement of the respective pixel electrode layers 14, 18, 22 those shown in FIGS. 2 to 6. At all events, it suffices that the respective configurations and respective arrangements of the R pixel region, the G pixel region, and the B pixel region as viewed in plan view be made those shown in FIGS. 2 to 6.

Also, since with the structures shown in FIGS. 2, 5, and 6, generation of aliasing can be suppressed only in one of the horizontal direction and the vertical direction, it is preferable to separately provide an optical low-pass filter that suppresses generation of aliasing in a direction perpendicular to the one direction. With the structures shown in FIGS. 3 and 4, even one optical low-pass filter is not needed, so that it is possible to further realize miniaturization and reduction in cost.

Second Embodiment

The fundamental structure of a solid-state imaging device to explain a second exemplary embodiment of the invention is substantially the same as that of the solid-state imaging device explained in the first embodiment. That is, with the structure, a signal charge generated in three pixel electrode layers stacked above a semiconductor substrate is once accumulated in an electric charge accumulating region provided on the semiconductor substrate and a signal corresponding to the signal charge accumulated therein is read to an outside with the use of VCCD and HCCD. However, the solid-state imaging device according to the second embodiment is structured such that at least one of the three pixel electrode layers included in one pixel part is divided into a plurality of sections, in which it is different from the first embodiment.

FIGS. 7A to 7D each is a plan view showing that pixel electrode layer included in the solid-state imaging device, by which the second embodiment of the invention is illustrated, and which is divided into a plurality of sections, as viewed from an incident side of light.

While a pixel electrode layer divided into a plurality of sections suffices to be any one of the pixel electrode layers 14, 18, 22 shown in FIG. 1, it is especially preferable to divide the pixel electrode layer 18 into a plurality of sections. In examples shown in FIGS. 7A to 7D, the pixel electrode layer 18 shown in FIG. 1 is divided into two sections, that is, a pixel electrode layer 18*a* and a pixel electrode layer 18*b*. It is preferred that the two pixel electrode layers 18*a*, 18*b*, respectively, are common in shape.

As shown in FIGS. 7A to 7D, by dividing the pixel electrode layer 18 into two, that is, the pixel electrode layer 18*a* and the pixel electrode layer 18*b* (which has the same meaning of dividing the G pixel region into two), an array pitch in a direction (for example, a left and right direction in FIG. 7C) perpendicular to a direction of division of the pixel electrode layer 18*a* and the pixel electrode layer 18*b* becomes smaller than an array pitch in the direction of the pixel electrode layer 18 when the pixel electrode layer 18 is not divided. Therefore, green light is decreased in sampling frequency with respect to the direction with the result that aliasing is suppressed. Since green light makes a main constituent of a brightness component, image data of high image quality can be created by suppressing aliasing for green light.

Figure 8:
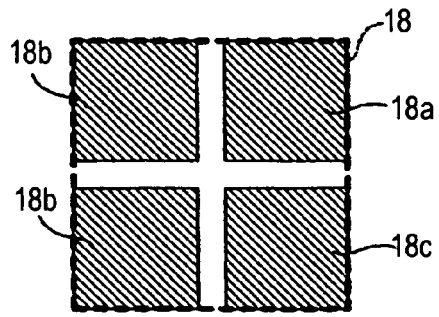
FIG. 8 is a plan view showing that pixel electrode layer included in the solid-state imaging device, by which the second embodiment of the invention is illustrated, and which is divided into a plurality of sections, as viewed from the light incident side.

In addition, since the pixel electrode layer 18 is divided into two sections in the example shown in FIGS. 7A to 7D, aliasing only in one direction can be suppressed, but aliasing in, for example, both the horizontal direction and the vertical direction can be suppressed by dividing the pixel electrode layer 18 into four sections, that is, pixel electrode layers 18*a* to 18*d* as shown in FIG. 8. While with the construction, in which aliasing only in the horizontal direction can be suppressed, it is necessary to use an optical low-pass filter that suppresses aliasing in the vertical direction, a manufacturing cost of a digital camera can be sharply reduced in the example shown in FIG. 8 since it is in no way necessary to use any optical low-pass filter. The examples shown in FIGS. 7A to 7D makes it necessary to use an optical low-pass filter but has an advantage that miniaturization and reduction in cost for a digital camera can be realized as compared with the case where an optical low-pass filter that suppresses aliasing in the both two directions is used. While the examples, in which the pixel electrode layer 18 is divided into two or four sections, have been described, an aliasing suppressing effect can be obtained by dividing the pixel electrode layer into two sections.

Figure 9:
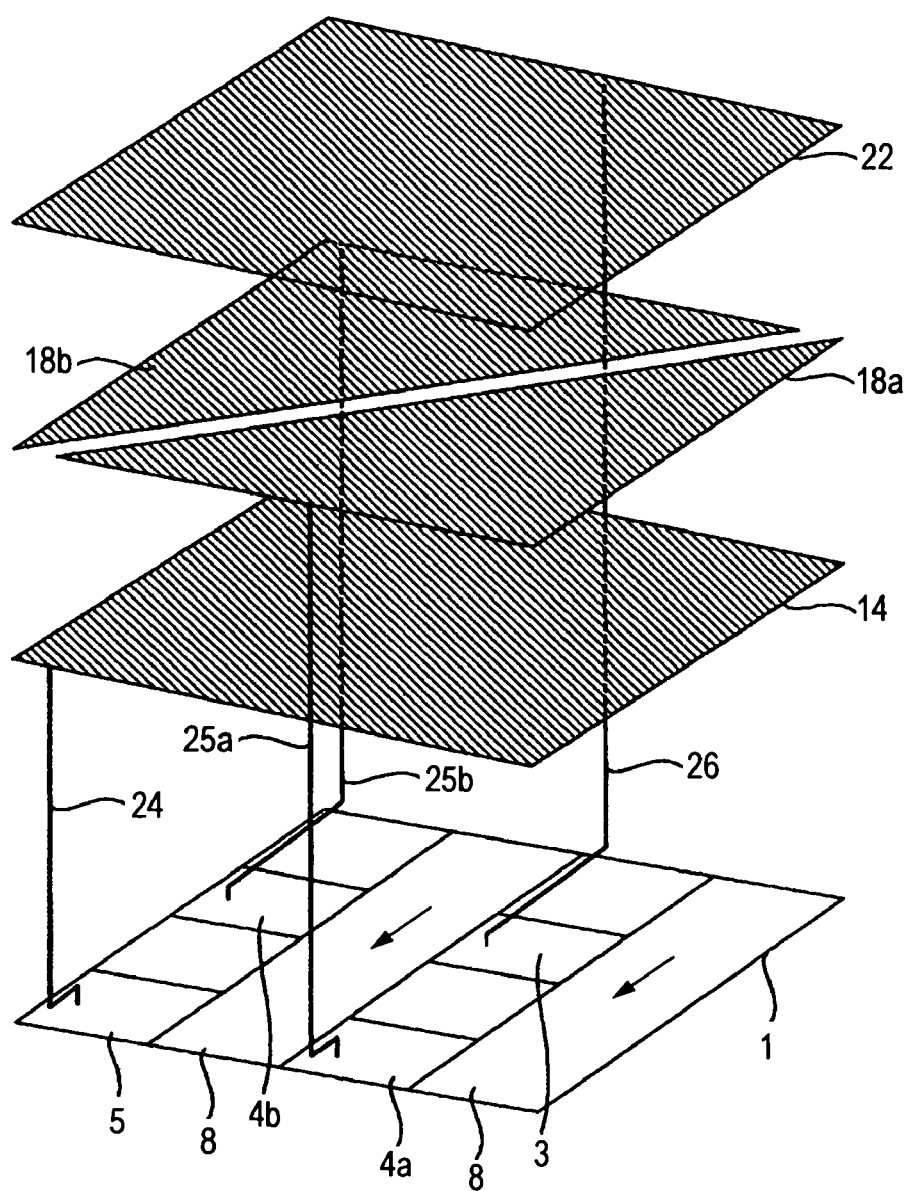
FIG. 9 is a perspective view schematically showing the structure of one pixel part of the solid-state imaging device to illustrate the second embodiment of the invention.

With the constructions shown in FIGS. 7A to 7D, four electric charge accumulating regions and four vertical wires are required for one pixel part, so that the construction of a solid-state imaging device is different from that shown in FIG. 1 and made one as shown in FIG. 9.

FIG. 9 is a perspective view schematically showing the structure of one pixel part of the solid-state imaging device, which illustrates the second embodiment of the invention. In FIG. 9, the same constituent parts as those in FIGS. 1 and 7A to 7D are denoted by the same reference numerals as those in the latter.

As shown in FIG. 9, a pixel electrode layer 14, pixel electrode layers 18*a*, 18*b*, and a pixel electrode layer 22 are stacked in this order above a semiconductor substrate 1. The pixel electrode layer 14 is connected to a n region 5 provided on the semiconductor substrate 1 by means of a vertical wire 24. The pixel electrode layer 18a is connected to a n region 4a provided on the semiconductor substrate 1 by means of a vertical wire 25a. The pixel electrode layer 18b is connected to a n region 4b provided on the semiconductor substrate 1 by means of a vertical wire 25b. The pixel electrode layer 22 is connected to a n region 3 provided on the semiconductor substrate 1 by means of a vertical wire 26. A signal charge generated in that Ga pixel region of a G photoelectric conversion layer 19 stacked on the pixel electrode layer 18a, which is interposed between the pixel electrode layer 18a and an opposing electrode layer 20 stacked on the G photoelectric conversion layer 19, is accumulated in the n region 4a. A signal charge generated in that Gb pixel region of the G photoelectric conversion layer 19 stacked on the pixel electrode layer 18b, which is interposed between the pixel electrode layer 18b and the opposing electrode layer 20 stacked on the G photoelectric conversion layer 19, is accumulated in the n region 4b. A signal charge as accumulated in the respective n regions is read in a n region 8 to be transferred in a vertical direction (a direction indicated by arrows in the figure) to be transferred in a horizontal direction by a HCCD (not shown). Then a signal corresponding to the signal charge as transferred is output outside from an output amplifier.

Obtained from one pixel part of the solid-state imaging device according to the embodiment are four color signals, that is, an R signal corresponding to a signal charge generated in an R pixel region, a Ga signal corresponding to a signal charge generated in a Ga pixel region, a Gb signal corresponding to a signal charge generated in a Gb pixel region, and a B signal corresponding to a signal charge generated in a B pixel region. Then the four color signals are subjected to signal processing in the following manner to create one pixel data.

FIG. 10 is a view showing a state, in which signals obtained from the solid-state imaging device shown in FIG. 9 are mapped on a memory.

As shown in FIG. 10, an R signal (depicted as R in the figure), a B signal (depicted as B in the figure), a Ga signal (depicted as Ga in the figure), and a Gb signal (depicted as Gb in the figure) are output every one pixel part from the solid-state imaging device. A part enclosed by a thick frame corresponds to signals output from one pixel part.

First, the Ga signal obtained from one pixel part is subjected to filter processing like the following formula (1) with the use of a matrix having filter coefficients, for example, as shown in FIG. 11 and a signal Gb' is found.

$$Ga' = \frac{1}{4}Gb + \frac{1}{2}Ga + \frac{1}{4}Gb \quad (1)$$

Then the Gb signal obtained from one pixel part is subjected to filter processing like the following formula (2) with the use of a matrix having filter coefficients, for example, as shown in FIG. 11 and a signal Gb' is found.

$$Gb' = \frac{1}{4}Ga + \frac{1}{2}Gb + \frac{1}{4}Ga \quad (2)$$

Finally, a signal G is found with the use of the following formula (3).

$$G = (Ga' + Gb')/2 \quad (3)$$

By performing such processing on signals obtained from all pixel parts, it is possible to obtain three RGB signals every one of all pixel parts to form color image data. In addition, the method of filter processing described above is not limitative. That is, it is possible to optionally and preferably set a method of filter processing according to hardware that performs filter processing, or an object and a design. Also, by using, for example, a filter having a many number of taps, it is possible to achieve an improvement in image quality.

While the first embodiment and the second embodiment present by way of example the solid-state imaging device with a plurality of photoelectric conversion layers stacked, the configuration and arrangement of the pixel region according to the invention are likewise applicable to a solid-state imaging device constructed such that one photoelectric conversion layer is stacked on a substrate.

Figure 12:
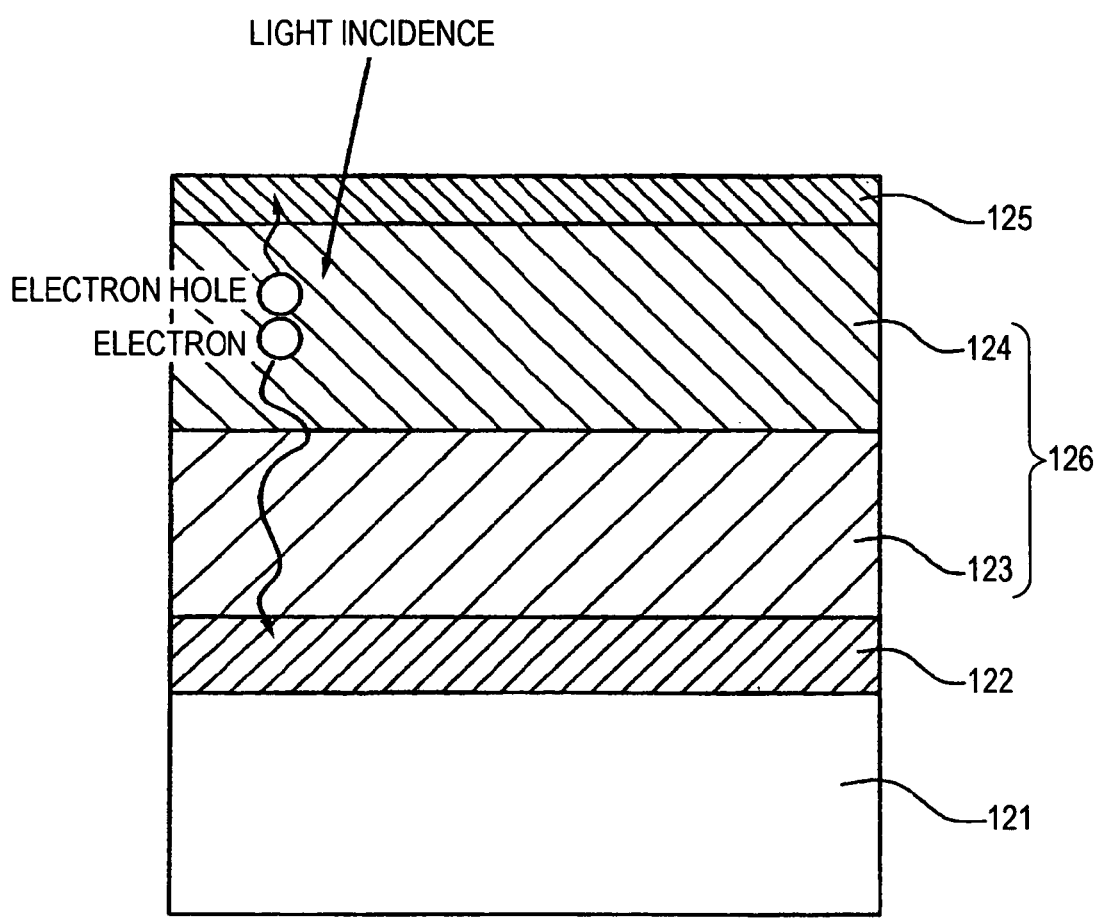
FIG. 12 is a schematic sectional view showing one pixel part of a solid-state imaging device constructed such that a photoelectric conversion layer is stacked in one layer.

FIG. 12 is a schematic sectional view showing one pixel part of a solid-state imaging device constructed such that a photoelectric conversion layer is stacked in one layer.

The solid-state imaging device shown in FIG. 12 is structured such that a silicon substrate 121, on which a signal readout circuit comprising a MOS circuit or the like is formed, a pixel electrode layer 122, a combined photoelectric conversion layer 126, and an opposing electrode layer 125 are stacked in this order. Light is incident from above the opposing electrode layer 125.

The pixel electrode layer 122 is made of, for example, Al having a thickness of 100 nm, and positive voltage is applied thereon.

The combined photoelectric conversion layer 126 is structured such that an electron hole blocking layer 123 and a photoelectric conversion layer 124 are stacked in this order.

The electron hole blocking layer 123 is made of, for example, Alq having a thickness of 100 nm. The electron hole blocking layer 123 serves to receive electrons generated on the photoelectric conversion layer 124 while preventing hole filling from the pixel electrode layer 122 and to convey the electrons to the pixel electrode layer 122. Also, the electron hole blocking layer 123 possesses a fine sensitivity. Since dark current due to hole filling is increased when voltage is applied to the pixel electrode layer 122, the electron hole blocking layer 123 is important in prevention of the dark current.

The photoelectric conversion layer 124 is made of, for example, a photorlrctric conversion material, such as copper phthalocyanine, porphyrin, Me-PTC, quinacrine, etc., having a thickness of 100 nm to 200 nm. When light is incident there, electron holes and electrons are generated, so that electron holes are accumulated on the opposing electrode layer 125 and electrons are accumulated on the pixel electrode layer 122. When the photoelectric conversion layer 124 has a thickness of about 100 nm, it is possible to absorb 90 to 99% of incident light assisted by reflection by the pixel electrode layer 122.

The opposing electrode layer 125 is made of, for example, ITO or Au and negative voltage is applied thereon. Deposition of the opposing electrode layer 125 is performed by sputtering, electron beam deposition, ion plating, or the like. When ITO is deposited on an organic material, a very poor yield is generally resulted due to short but when a thickness of ITO is made less than about 10 nm, the yield is improved. When damage to an organic material is great, a gold thin layer can also be used for the opposing electrode layer although a decrease in transmissivity is resulted. The gold thin layer desirably has a thickness less than about 15 nm.

Al, a photoelectric conversion material, and Alq are deposied by means of vacuum deposition. At this time, degree of vacuum is desirably $10^{-4}$ Pa.

While an absolute value of voltage applied to the pixel electrode layer 122 and the opposing electrode layer 125 is normally 1 V to 30 V, an external quantum efficiency at about 15 V and at a maximum absorption wavelength is lowered 20 to 40%, and at a further increased voltage, the external quantum efficiency is increased but dark current is increased due to carrier filling from the respective electrodes, so that a decrease in SN ratio is resulted.

Since a photoelectric conversion layer made of an organic material is deteriorated by oxygen and water content, it is necessary to provide a sealing layer such as silicon nitride, etc. on the opposing electrode layer 125. At this time, it suffices to deposit the sealing layer by means of low damage sputtering, low damage plasma CVD, or the like so as not to cause damage to the combined photoelectric conversion layer 126.

Figure 13:
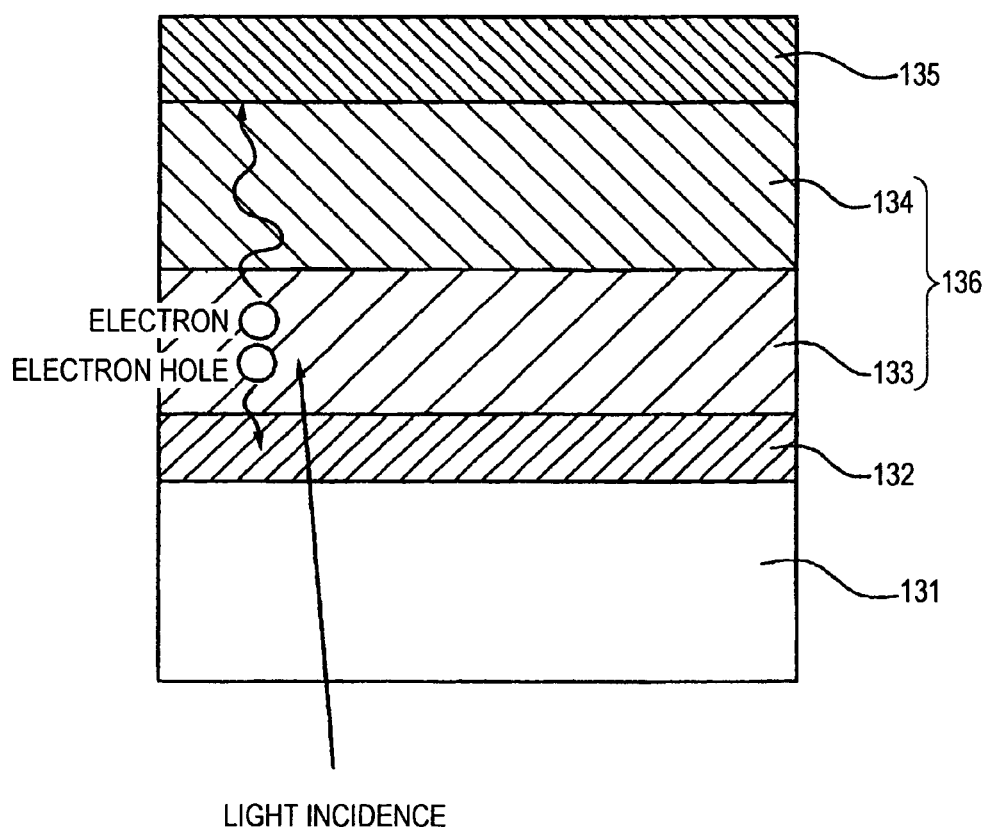
FIG. 13 is a schematic sectional view showing one pixel part of a solid-state imaging device constructed differently such that a photoelectric conversion layer is stacked in one layer.

FIG. 13 is a schematic sectional view showing one pixel part of a solid-state imaging device constructed differently such that a photoelectric conversion layer is stacked in one layer.

The solid-state imaging device shown in FIG. 13 is structured such that a transparent substrate 131 such as glass, a flexible substrate, etc., a pixel electrode layer 132, a combined photoelectric conversion layer 136, and an opposing electrode layer 135 are stacked in this order. Light is incident from below the transparent substrate 131.

The pixel electrode layer 132 is made of, for example, ITO having a thickness of 50 nm and negative voltage is applied thereon. Deposition of the pixel electrode layer 132 is performed by sputtering, electron beam deposition, ion plating, or the like. The layer thickness is desirably thin since an increase in transmissivity is resulted and sensitivity is improved.

The combined photoelectric conversion layer 136 is structured such that a photoelectric conversion layer 133 and an electron hole blocking layer 134 are stacked in this order.

The electron hole blocking layer 134 is made of, for example, Alq having a thickness of 100 nm. The electron hole blocking layer 134 serves to receive electrons generated on the photoelectric conversion layer 133 while preventing hole filling from the opposing electrode layer 135 and to convey the electrons to the opposing electrode layer 135. Also, the electron hole blocking layer 134 possesses a fine sensitivity. Since dark current due to hole filling is increased when voltage is applied to the opposing electrode layer 135, the electron hole blocking layer 134 is important in prevention of the dark current.

The photoelectric conversion layer 133 is made of, for example, a photoelectric conversion material, such as copper phthalocyanine, porphyrin, Me-PTC, quinacrine, etc., having a thickness of 100 nm to 200 nm. When light is incident there, electron holes and electrons are generated, so that electron holes are accumulated on the pixel electrode layer 132 and electrons are accumulated on the opposing electrode layer 135. When the photoelectric conversion layer 133 has a thickness of about 100 nm, it is possible to absorb 90 to 99% of incident light assisted by reflection by the opposing electrode layer 135.

A photoelectric conversion material and Alq are deposited by means of vacuum deposition and at this time, degree of vacuum is desirably $10^{-4}$ Pa.

The opposing electrode layer 135 is made of, for example, Al, ITO, or Au and positive voltage is applied thereon. Deposition of the opposing electrode layer 135 is performed by sputtering, electron beam deposition, ion plating, or the like. When ITO is deposited on an organic material, a very poor yield is generally resulted due to short but when a thickness of ITO is made less than about 10 nm, the yield can be improved. When damage to an organic material is great, a gold thin layer can also be used for the opposing electrode layer although a decrease in transmissivity is resulted. The gold thin layer desirably has a thickness less than about 15 nm.

While an absolute value of voltage applied to the pixel electrode layer 132 and the opposing electrode layer 135 is normally 1 V to 30 V, an external quantum efficiency at about 15 V and at a maximum absorption wavelength is lowered 20 to 40%, and at a further increased voltage, the external quantum efficiency is increased but dark current is increased due to carrier filling from the respective electrodes, so that a decrease in SN ratio is resulted.

Since a photoelectric conversion layer made of an organic material is deteriorated by oxygen and water content, it is necessary to provide a sealing layer such as silicon nitride, etc. on the opposing electrode layer 135. At this time, it suffices to deposit the sealing layer by means of low damage sputtering, low damage plasma CVD, or the like so as not to cause damage to the photoelectric conversion layer.

Also, while not shown, electrically connected to the opposing electrode layer 135 is a substrate, or the like, on which a signal readout circuit for reading a signal corresponding to electrons accumulated there is formed.

It will be apparent to those skilled in the art that various modifications and variations can be made to the described embodiments of the invention without departing from the spirit or scope of the invention. Thus, it is intended that the invention cover all modifications and variations of this invention consistent with the scope of the appended claims and their equivalents.

The present application claims foreign priority based on Japanese Patent Application Nos. JP2005-30197 and JP2005-237607, filed Feb. 7 and Aug. 18 of 2005, respectively, the contents of which is incorporated herein by reference.

What is claimed is:

1. A solid-state imaging device comprising:
a semiconductor substrate; and
a plurality of pixel parts including a photoelectric conversion layer, the plurality of pixel parts being arranged in a plane parallel to the semiconductor substrate;
wherein the photoelectric conversion layer is interposed between pixel electrodes, each generating signal charge used for formation of pixel data, and
the pixel electrodes have a configuration and arrangement determined so that a first straight line extending in a first direction in the plane parallel to the semiconductor substrate intersects two respective pixel electrodes aligning adjacent to each other in a second direction perpendicular to the first direction, the second direction being in the plane parallel to the semiconductor substrate, wherein said configuration is such that a light detecting area in one pixel region in at least one direction partially overlaps a light detecting area in a pixel region adjacent thereto in order to suppress aliasing in said at least one direction.

2. The solid-state imaging device according to claim 1, wherein each of the pixel regions is in the form of a parallelogram in the plane parallel to the semiconductor substrate.

3. The solid-state imaging device according to claim 1, wherein each of the pixel regions comprises: a first convex portion projecting in the second direction; and a first concave portion dented in the second direction, and the pixel regions are arranged so that a part of the first convex portion of a pixel region extends into the first concave portion of an adjoining pixel region in the second direction.

4. The solid-state imaging device according to claim 1, further comprising an optical low-pass filter that suppress generation of aliasing in the first direction.

5. The solid-state imaging device according to claim 1, wherein a range of light detectable in one pixel region in the first direction partially overlaps a range of light detectable in the pixel region adjacent thereto so that aliasing in the first direction is suppressed.

6. The solid-state imaging device according to claim 1, wherein a range of light detectable in one pixel region in the second direction partially overlaps a range of light detectable in the pixel region adjacent thereto so that aliasing in the second direction is suppressed.

7. The solid-state imaging device according to claim 1, wherein a range of light detectable in one pixel region in the first and second direction partially overlaps a range of light detectable in the pixel region adjacent thereto so that aliasing in the first and second direction is suppressed.

8. The solid-state imaging device according to claim 1, wherein the pixel regions have a configuration and arrangement determined so that a second straight line extending in the second direction intersects two respective pixel regions aligning adjacent to each other in the first direction.

9. The solid-state imaging device according to claim 8, wherein
each of the pixel regions comprises: a first convex portion projecting in the second direction; a first concave portion dented in the second direction; a second convex portion projecting in the first direction; and a second concave portion dented in the first direction, and
the pixel regions are arranged so that: a part of the first convex portion of a pixel region puts in the first concave portion of an adjoining pixel region in the second direction; and a part of the second convex portion of a pixel region extends into the second concave portion of an adjoining pixel region in the first direction.

* * * * *